United States Patent
Marrow et al.

(10) Patent No.: US 10,469,290 B1
(45) Date of Patent: Nov. 5, 2019

(54) REGULARIZED PARAMETER ADAPTATION

(71) Applicant: Seagate Technology LLC, Cupertino, CA (US)

(72) Inventors: Marcus Marrow, San Jose, CA (US); Jason Bellorado, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/800,738

(22) Filed: Nov. 1, 2017

Related U.S. Application Data

(60) Provisional application No. 62/522,248, filed on Jun. 20, 2017.

(51) Int. Cl.
*H04L 25/03* (2006.01)

(52) U.S. Cl.
CPC .............. *H04L 25/03019* (2013.01)

(58) Field of Classification Search
CPC ............................................ H04L 25/03019
See application file for complete search history.

(56) References Cited

U.S. PATENT DOCUMENTS

| | | | |
|---|---|---|---|
| 5,321,564 A | 6/1994 | Takahashi | |
| 5,543,978 A * | 8/1996 | Park | G11B 5/09 360/46 |
| 5,654,765 A * | 8/1997 | Kim | H04N 5/211 348/614 |
| 5,742,532 A | 4/1998 | Duyne et al. | |
| 5,970,093 A | 10/1999 | Lantremange | |
| 6,157,510 A | 12/2000 | Schreck et al. | |
| 6,222,592 B1 * | 4/2001 | Patel | H04L 25/03006 348/607 |
| 6,320,920 B1 | 11/2001 | Beyke | |
| 6,377,552 B1 | 4/2002 | Moran et al. | |
| 6,505,222 B1 * | 1/2003 | Davis | H03M 13/00 375/233 |
| 6,580,676 B1 * | 6/2003 | Yanagisawa | G11B 7/005 369/124.02 |
| 6,633,894 B1 * | 10/2003 | Cole | H03H 21/0012 375/232 |
| 6,665,308 B1 * | 12/2003 | Rakib | H03M 13/256 348/E7.07 |
| 6,687,073 B1 | 2/2004 | Kupferman | |
| 6,697,891 B2 | 2/2004 | Emberty et al. | |
| 6,738,215 B2 | 5/2004 | Yatsu | |

(Continued)

OTHER PUBLICATIONS

Bellorado et al., "Target Parameter Adaptation", U.S. Appl. No. 15/334,167, filed Oct. 25, 2016, Seagate Technology LLC.

*Primary Examiner* — Jean B Corrielus

(74) *Attorney, Agent, or Firm* — Setter Roche LLP; Kirk A. Cesari

(57) ABSTRACT

An apparatus may include a circuit configured to process at least one input signal using a set of channel parameters. The circuit may adapt, using a regularized adaptation algorithm, a first set of channel parameters for use by the circuit as the set of channel parameters in processing the at least one input signal, the regularized adaptation algorithm penalizing deviations by the first set of channel parameters from a corresponding predetermined second set of channel parameters. The circuit may then perform the processing of the at least one input signal using the first set of channel parameters as the set of channel parameters.

16 Claims, 5 Drawing Sheets

(56) References Cited

U.S. PATENT DOCUMENTS

| | | | |
|---|---|---|---|
| 6,950,258 B2 | 9/2005 | Takaishi | |
| 6,993,291 B2 | 1/2006 | Parssinen et al. | |
| 7,046,701 B2 | 5/2006 | Mohseni et al. | |
| 7,133,233 B1 | 11/2006 | Ray et al. | |
| 7,245,448 B2 | 7/2007 | Urata | |
| 7,298,573 B2 | 11/2007 | Kitamura | |
| 7,324,437 B1* | 1/2008 | Czylwik | H04L 1/06 370/203 |
| 7,362,432 B2 | 4/2008 | Roth | |
| 7,940,667 B1 | 5/2011 | Coady et al. | |
| 7,948,703 B1* | 5/2011 | Yang | G11B 20/10009 360/68 |
| 8,139,301 B1 | 3/2012 | Li et al. | |
| 8,172,755 B2 | 5/2012 | Song et al. | |
| 8,400,726 B1 | 3/2013 | Wu et al. | |
| 8,479,086 B2* | 7/2013 | Xia | G11B 27/36 714/795 |
| 8,514,506 B1 | 8/2013 | Li et al. | |
| 8,539,328 B2* | 9/2013 | Jin | G11B 20/10046 714/819 |
| 8,542,766 B2 | 9/2013 | Chekhovstov et al. | |
| 8,837,068 B1 | 9/2014 | Liao et al. | |
| 8,861,111 B1 | 10/2014 | Liao et al. | |
| 8,861,112 B1 | 10/2014 | Pan et al. | |
| 8,953,276 B1 | 2/2015 | Pokharel et al. | |
| 9,007,707 B1 | 4/2015 | Lu et al. | |
| 9,064,537 B1 | 6/2015 | Nie et al. | |
| 9,082,418 B2 | 7/2015 | Ong et al. | |
| 9,099,132 B1 | 8/2015 | Grundvig et al. | |
| 9,129,650 B2 | 9/2015 | Mathew et al. | |
| 9,196,298 B1 | 11/2015 | Zhang et al. | |
| 9,245,579 B2 | 1/2016 | Song et al. | |
| 9,245,580 B1 | 1/2016 | Lu et al. | |
| 9,257,135 B2 | 2/2016 | Ong et al. | |
| 9,311,937 B2 | 4/2016 | Zou et al. | |
| 9,401,161 B1 | 7/2016 | Jury et al. | |
| 9,424,878 B1 | 8/2016 | Dziak et al. | |
| 9,431,052 B2 | 8/2016 | Oberg et al. | |
| 9,508,369 B2 | 11/2016 | Chu et al. | |
| 9,564,157 B1 | 2/2017 | Trantham | |
| 9,590,803 B2 | 3/2017 | Derras et al. | |
| 9,672,850 B2 | 6/2017 | Grundvig et al. | |
| 9,728,221 B2 | 8/2017 | Oberg et al. | |
| 10,152,457 B1* | 12/2018 | Bellorado | H03H 17/00 |
| 2002/0181439 A1* | 12/2002 | Orihashi | H04J 3/0605 370/350 |
| 2003/0198165 A1* | 10/2003 | Mouri | G11B 20/10009 369/53.35 |
| 2004/0228397 A1* | 11/2004 | Bach | H04L 25/03038 375/232 |
| 2005/0117243 A1* | 6/2005 | Serizawa | G11B 5/035 360/65 |
| 2007/0177292 A1* | 8/2007 | Bui | G11B 20/10037 360/46 |
| 2008/0175309 A1* | 7/2008 | Fimoff | H04L 25/03019 375/232 |
| 2010/0290153 A1 | 11/2010 | Hampshire | |
| 2011/0002375 A1* | 1/2011 | Honma | H04L 25/03038 375/232 |
| 2011/0090773 A1* | 4/2011 | Yu | G11B 20/10009 369/47.15 |
| 2011/0176400 A1 | 7/2011 | Gerasimov | |
| 2012/0155577 A1* | 6/2012 | Shukla | H04L 25/022 375/340 |
| 2013/0076433 A1* | 3/2013 | Fratti | H04L 25/02 327/551 |
| 2015/0003221 A1* | 1/2015 | Sankaranarayanan | G11B 20/10046 369/13.32 |
| 2016/0112218 A1* | 4/2016 | Abe | H04B 7/0854 375/261 |
| 2016/0293205 A1* | 10/2016 | Jury | G11B 20/10046 |
| 2017/0249206 A1* | 8/2017 | Jeong | G06F 11/0793 |

\* cited by examiner

REGULARIZED PARAMETER ADAPTATION

SUMMARY

In certain embodiments, an apparatus may include a circuit configured to process at least one input signal using a set of channel parameters. The circuit may adapt, using a regularized adaptation algorithm, a first set of channel parameters for use by the circuit as the set of channel parameters in processing the at least one input signal, the regularized adaptation algorithm penalizing deviations by the first set of channel parameters from a corresponding predetermined second set of channel parameters. The circuit may then perform the processing of the at least one input signal using the first set of channel parameters as the set of channel parameters.

In certain embodiments, a system may include a channel circuit configured to process at least one input signal using a set of channel parameters and an adaptation circuit configured to adapt, using a regularized adaptation algorithm, a first set of channel parameters for use by the channel circuit as the set of channel parameters in processing the at least one input signal, the regularized adaptation algorithm penalizing deviations by the first set of channel parameters from a predetermined corresponding second set of channel parameters.

In certain embodiments, a method may include adapting, by a circuit configured to process at least one input signal using a set of channel parameters and using a regularized adaptation algorithm, a first set of channel parameters for use by the circuit as the set of channel parameters in processing the at least one input signal, the regularized adaptation algorithm penalizing deviations by the first set of channel parameters from a corresponding predetermined second set of channel parameters. Additionally, the method may include performing the processing of the at least one input signal using the first set of channel parameters as the set of channel parameters.

DETAILED DESCRIPTION

Figure 1:
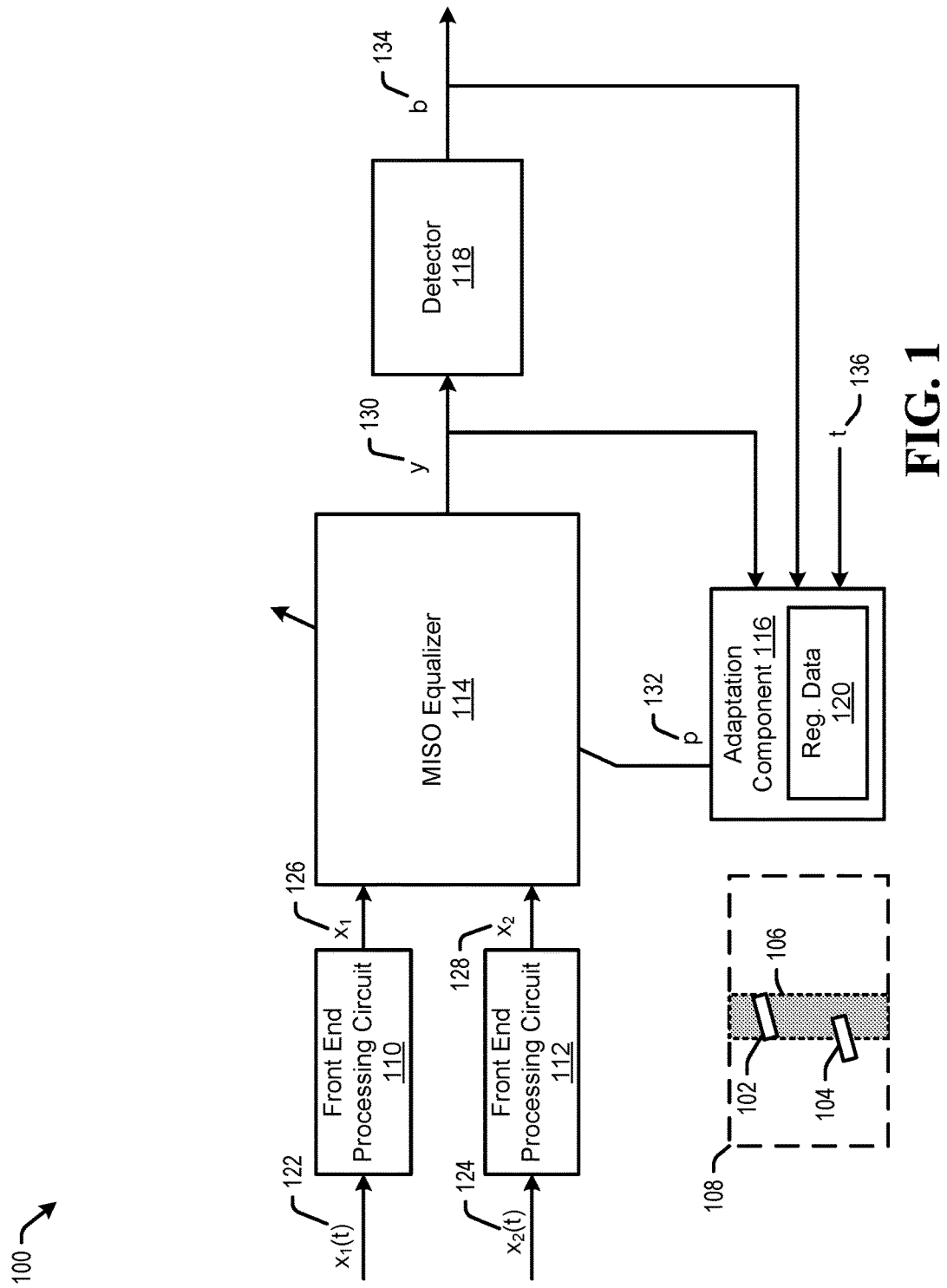
FIG. 1 is a block diagram of a communication channel which includes regularized parameter adaptation, in accordance with certain embodiments of the present disclosure.

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

The present disclosure generally may relate to regularized parameter adaptation, and in some embodiments, the present disclosure may relate to regularized parameter adaptation of parameters of a multi-input single-output (MISO) equalizer in a multiple read head system.

Some systems, such as electrical, electronic, motor drive, processing, or other systems may receive a signal of interest and process that signal based on parameters. For example, a read channel of a communication system or a magnetic recording storage system may utilize adaptive parameters to process at least one input signal. In some multi-reader or multi-receiver systems, a detector may generate a data sequence based on an equalized sample sequence produced by a MISO equalizer that receives a plurality of digitized sample sequences corresponding to respective read heads. An adaptation component may include various adaptive functions or algorithms for adapting the parameters of the MISO equalizer. For example, the adaptive parameters may be coefficients or taps of a plurality of finite impulse response filters (FIRs) within the MISO equalizer. For example, in some embodiments, a MISO equalizer may produce an equalized sample sequence based on parameters that were adapted using a regularized adaptation algorithm. In some examples, a regularized adaptation algorithm may utilize or may be based on a cost function that may penalize or dampen deviation from a known set of parameter values (e.g. predetermined tap values).

An example of such a system is discussed below with regard to FIG. 1.

Referring to FIG. 1, a block diagram of a communication channel which includes regularized parameter adaptation is shown and is generally designated 100. More particularly, FIG. 1 may illustrate an example embodiment of a read channel of a multi-reader magnetic storage system that includes regularized parameter adaptation. System 100 may include two read heads, read head 102 and read head 104, which may be reading from a track 106 on a surface 108 of a magnetic storage medium. Read heads 102 and 104 may be coupled to respective front-end-processing circuits 110 and 112 (e.g. illustrated as the inputs to 110 and 112). The front-end-processing circuits 110 and 112 may be coupled to a MISO equalizer 114. The MISO equalizer 114 may be coupled to a detector 118. The detector 118 may be coupled to an adaptation component 116 and an output (e.g. an output from the communication channel 100 or an output to a decoder (not shown)). The adaptation component 116 may be connected to the MISO equalizer 114. The adaptation component 116 may also include a memory for storing regularization data 120 or access regularization data 120 stored in a separate memory (not shown).

Each of the read heads 102 and 104, the front-end-processing circuits 110 and 112, the MISO equalizer 114, the detector 118, and the adaptation component 116 may be a separate circuit, a system on chip (SOC), firmware, a processor(s), or other system not listed, or any combination thereof.

As mentioned above, the read heads 102 and 104 may read from a track 106 on a surface 108 of a magnetic storage medium. The read heads 102 and 104 may each produce a continuous time input signal $x_1(t)$ 122 and $x_2(t)$ 124 and may provide the continuous time input signals $x_1(t)$ 122 and $x_2(t)$ 124 to front-end-processing circuits 110 and 112 respectively.

The front-end-processing circuit 110 may apply gain, filtering, sampling and a delay functions to the continuous time input signal $x_1(t)$ 122 to produce a sequence of digitized samples $x_1$ 126. In some embodiments, the front-end-processing circuits may include various components such as analog front-ends (AFEs) and analog-to-digital converters (ADCs). Similarly, the front-end-processing circuit 112 may apply gain, filtering, sampling and a delay functions to the continuous time input signal $x_2(t)$ 124 to produce a sequence of digitized samples $x_2$ 128. For example, after applying gain and filter functions to the continuous time input signals (e.g. by a variable gain amplifier and an analog-based filter), the front-end-processing circuits 110 and 112 may sample the respective continuous-time signals at regular intervals and may quantize the respective signals to produce the respective digitized sequences of samples $x_1$ 126 and $x_2$ 128. The front-end-processing circuits 110 and 112 may then apply a delay to one or both of $x_1$ 126 and $x_2$ 128 to synchronize the read positions of read head 102 and read head 104 (e.g. to compensate for down track separation of read heads 102 and 104 (shown as vertical separation in the view of FIG. 1)). The front-end-processing circuits 110 and 112 may then output $x_1$ 126 and $x_2$ 128 to the MISO equalizer 114.

The MISO equalizer 114 may receive the digitized sequences of samples $x_1$ 126 and $x_2$ 128 and parameters p 132 and generate an equalized sample sequence y 130.

The MISO equalizer 114 can be a filter. In general, MISO equalizers may combine a plurality of input signals to produce a single output signal which may be provided to a processor, channel, buffer, other circuit, or any combination thereof. For example, a MISO equalizer may be an N input (e.g. where N may be a number of read heads) adaptive equalizer including N finite impulse response filters having L taps. In some examples, the L taps may be weighting factors (e.g. spectral weighting) that may be applied to the different inputs. However, implementations are not so limited. In other implementations, the MISO equalizer may perform a simple or weighted average. As discussed in more detail below, the taps or parameters p 132 of the MISO equalizer 114 may be adapted by and received from the adaptation component 116.

The detector 118 may operate to determine (or estimate) a data sequence b 134 of bit values corresponding to the signals $x_1(t)$ 122 and $x_2(t)$ 124 based on the equalized sample sequence y 130. In some embodiments, the data sequence b 134 may be representative of the probability that each bit is a zero or one. The values 134 may be represented as logs of the ratios of these probabilities and may be referred to as log likelihood ratios or LLRs. The detector 118 may act to generate the LLRs values based on knowledge of a channel response (e.g. the expected channel output for each possible written/transmitted data pattern). In some examples, the detector 118 may employ a Soft-Output Viterbi Algorithm (SOVA). In addition, the detector 118 may be an iterative decoding unit and include a decoder in addition to a detector (e.g. a SOVA detector and a low-density parity-check (LDPC) decoder). Alternatively or in addition, the detector 118 may operate to determine (or estimate) the data sequence b 134 of bit values as decisions as to whether each bit is a zero or one.

The adaptation component 116 may operate to receive the equalized sample sequence y 130, the data sequence b 134 or known write data t 136, and adapt the parameters p 132 of the MISO equalizer 114.

The taps or parameters p 132 of the MISO equalizer 114 may be adapted based on regularized versions of adaptation algorithms, such as regularized least mean squares (LMS) algorithms, regularized Minimum Bit-Error Rate (MBER) algorithms, or regularized recursive least-squares (RLS) algorithms. In some examples, a MISO equalizer of a multi-read head hard disc drive read channel may utilize a regularized adaptation algorithm that may penalize or dampen deviation from previously determined on-track read parameters which may be stored as regularization data 120. For example, the adaptation component 116 may adapt parameters p 132 of the MISO equalizer 114 using LMS or other adaptive algorithms to minimize regularized versions of the mean squared error, bit error rate or other adaptive criteria.

The regularization data 120 may be generated during manufacturing or during a training process in the field. In the case of a hard disc drive or other devices whose parameters vary across the medium, the regularization data 120 may be generated for each storage unit (e.g. sectors, pages, etc.) or for larger regions or zones that may corresponding to groups of tracks (which is the case in the example discussed below). During generation of the regularization data, parameter sets may be generated (e.g. adapted) using known write data and, for example, samples from read signals during a on-track read. The generated parameter sets may then be stored for use as regularization parameters during normal operation.

Additional details of an example regularized adaptation process are provided below with regard to FIG. 2.

In the examples discussed herein, the parameters that are adapted are the parameters of the MISO equalizer. While the discussion herein utilizes parameters of a MISO equalizer of a read channel as examples, the disclosed techniques and systems may apply to other circuits or parameters. Many variations would be apparent to one of ordinary skill in the art in view of this disclosure.

Figure 2:
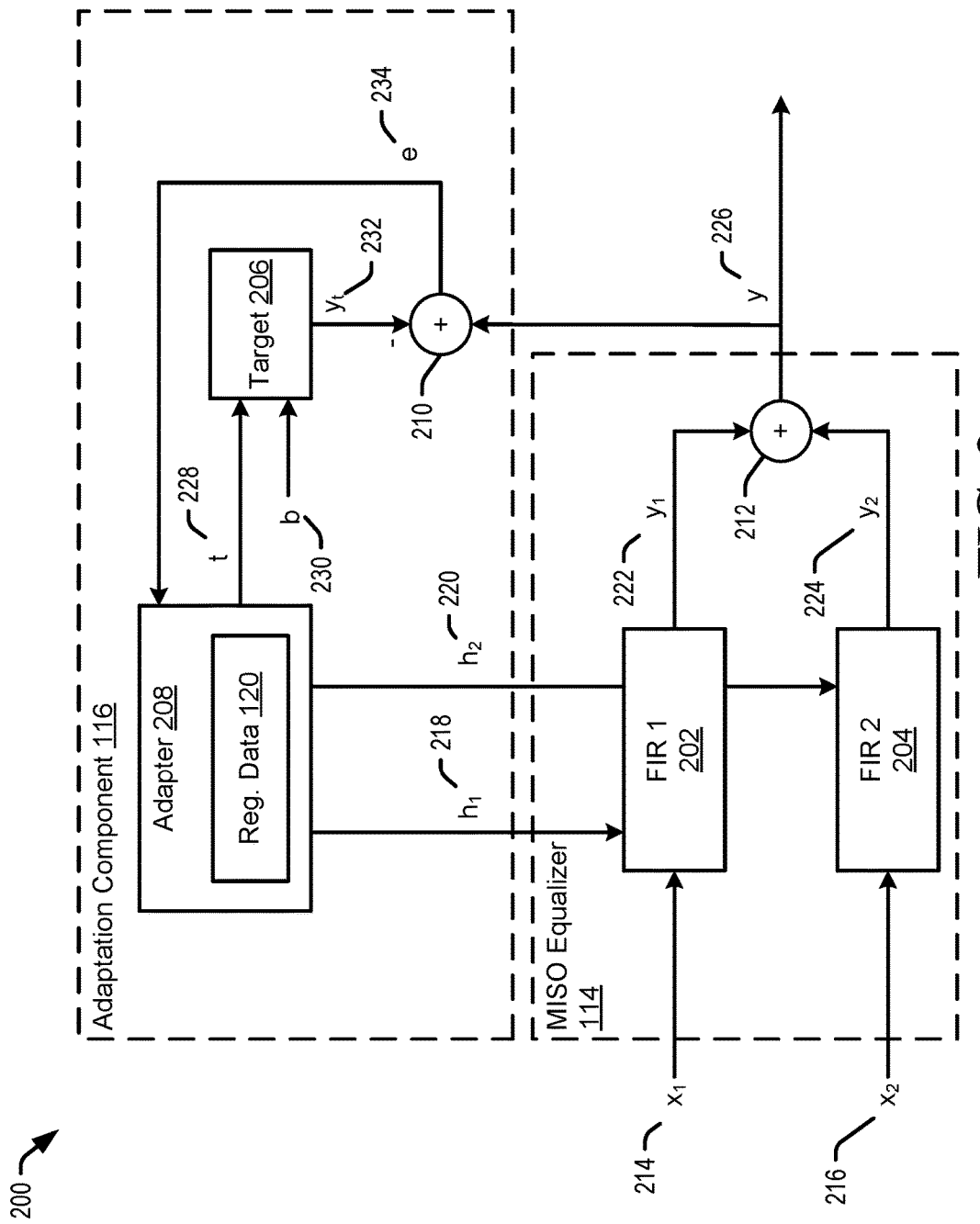
FIG. 2 is a block diagram of a portion of a communication channel which includes regularized parameter adaptation, in accordance with certain embodiments of the present disclosure.

Referring to FIG. 2, a block diagram of a portion of a communication channel which includes regularized parameter adaptation is shown and is generally designated 200. More particularly, FIG. 2 illustrates a more detailed example embodiment of the MISO equalizer 114 and adaptation component 116 of the multi-reader magnetic storage system 100 illustrated in FIG. 1.

As mentioned above, system 200 may include the MISO equalizer 114 and adaptation component 116. The MISO equalizer 114 may include two finite impulse response (FIR) filters, FIR 1 202 and FIR 2 204, that each may be coupled to an adder 212. The adder 212 may be coupled to an adder 210 of the adaptation component 116 and to an output (e.g. to a detector or decoder that is not shown). The adder 210 may be coupled to an adapter 208 which may be coupled the FIR 1 202 and the FIR 2 204 of the MISO equalizer 114 and to a target 206 of the adaptation component 116. The target 206 may be coupled to the adder 210. The adapter 208 may also include a memory for storing regularization data 120 or access regularization data 120 stored in a separate memory (not shown). Each of FIR 1 202, FIR 2 204, adders 210 and 212, target 206 and adapter 208 may be a separate circuit, a system on chip (SOC), firmware, a processor(s), or other system not listed, or any combination thereof.

In operation, FIR 1 202 and FIR 2 204 may receive the respective digitized sequences of samples $x_1$ 214 and $x_2$ 216 (e.g. which may correspond to digitized sequences of samples $x_1$ 126 and $x_2$ 128) from respective ADCs and parameters $h_1$ 218 and $h_2$ 218 from the adapter 208. Using parameters $h_1$ 218 and $h_2$ 218 (e.g. as tap weights or coefficients), FIR 1 202 and FIR 2 204 may perform filter functions on the respective digitized sequences of samples $x_1$ 214 and $x_2$ 216 to produce respective intermediate equalized sequences of samples $y_1$ 222 and $y_2$ 224. The adder 212 may receive and combine (e.g. sum) the intermediate equalized sequences of samples $y_1$ 222 and $y_2$ 224 to produce an equalized sequences of samples y 226.

The target 206 may receive parameters t 228 from the adapter 208 and decision data b 230 (or known write data). Based on t 228 and b 230, the target 206 may generate a target equalized sequence of samples $y_t$ 232, for example, by performing a target response filter function.

The adder 210 may receive the equalized sequences of samples y 226 and the target equalized sequences of samples $y_t$ 232. The adder 210 may determine the error e 234 as the difference between y 226 and $y_t$ 232 (e.g. by subtracting $y_t$ 232 from y 226).

The adapter 208 may receive the error e 234. The adapter 208 may adapt the parameters $h_1$ 218 and $h_2$ 220 using a regularized adaptation algorithm based on the error 234 and the regularization data 120. Depending on the implementation, the adapter 208 may adapt parameters t 228 using a regularized or standard adaptation algorithm. For example, during normal operation, the adaptation of parameters t 228 may be halted. In such cases, regularization of the adaptation of parameters t 228 may provide no benefit over standard adaptation. Details are provided below of an example regularized adaptation algorithm and example modifications that may be used to regularize the adaptation algorithm.

In some examples, the parameters of the FIR filters FIR 1 202 and FIR 2 204 may be adapted using a regularized minimum mean squared error (MMSE) cost function, and, in particular examples, using a regularized least means squares (LMS) stochastic gradient descent adaptation algorithm. Standard LMS adaptation in MISO equalizers may be ill-conditioned during periods when the FIR inputs are similar (e.g. when the read signals are of similar or equal quality). This may result in the error surface of error 234 being flat or having shallow slope. This may in turn result in the parameters or coefficients wandering randomly in response to minor differences in the similar inputs. Once the parameters or coefficients of the MISO equalizer have wandered, performance loss may arise when the inputs diverge, for example, from an off-track read. In particular, for an off-track read, this wandering or ill-conditioning may provide a random initialization to the parameters or coefficients, which may be far away from the correct weights. As such, performance may be lost due to an increased transient time to return to well-conditioned parameters or coefficients.

In some embodiments, using a regularized minimum mean squared error (MMSE) cost function, and, in particular, using the least means squares (LMS) stochastic gradient descent adaptation algorithm, may avoid the wandering discussed above. As mentioned above, regularizing an adaptation algorithm may include adding a penalty for or damp-ening of deviation from previously determined on-track read parameters to the cost function or adaptation algorithm.

In a standard MMSE adaptation, the cost function being minimized may be:

$$J(\bar{t}, \bar{h_1}, \bar{h_2}) = E[e^2]$$
$$= E[(y - y_t)^2]$$
$$= E[(x_1 \otimes \bar{h_1} + x_2 \otimes \bar{h_2} - b \otimes \bar{t})^2]$$

A regularized MMSE cost function may penalize parameter or weight deviations from pre-determined values, $h_{1,reg}$ and $h_{2,reg}$. As mentioned above, the predetermined values $h_{1,reg}$ and $h_{2,reg}$ may be loaded from the regularization data 120 and may, for example, be parameters whose adaptation converged during an on-track read of the zone or area associated with the current track or sector.

An example regularized MMSE cost function may be written as:

$$J(\bar{t},\bar{h}_1,\bar{h}_2)=E[e^2+\Delta(\Sigma(h_1-h_{1,reg})^2\Sigma(h_2-h_{2,reg})^2)]$$

where $\lambda$ is a regularization parameter that may determine a relative weight of the regularization terms of the cost function. In other words, the greater $\lambda$ is set, the more penalty is applied for deviations from the predetermined values, $h_{1,reg}$ and $h_{2,reg}$.

Based on the above example regularized MMSE cost function, the standard LMS coefficient update equation (which may use an approximate gradient of J with respect to the coefficient):

$$h_{1,i} \rightarrow h_{1,i} - \mu x_{1,j-i} * e_j$$

$$h_{2,i} \rightarrow h_{2,i} - \mu x_{2,j-i} * e_j,$$

may be modified to be:

$$h_{1,i} \rightarrow h_{1,i} - \mu x_{1,j-i} * e_j - \lambda(h_{1,i} - h_{1,reg,i})$$

$$h_{2,i} \rightarrow h_{2,i} - \mu x_{2,j-i} * e_j - \lambda(h_{2,i} - h_{2,reg,i}).$$

where i may be the coefficient index, and j may be the time index.

As mentioned above, in a multi-reader HDD system, a good choice for the regularized coefficients, $h_{1,reg}$ and $h_{2,reg}$ of a MISO equalizer may be the on-track adapted parameters. In this case, the regularization may prevent the parameters from wandering too far from an on-track optimum.

In the examples discussed herein, the parameters that are adapted may be the parameters of the MISO equalizer. While the discussion herein utilizes parameters of a MISO equalizer of a read channel as examples, the disclosed techniques and systems may apply to other circuits or parameters and different modified cost functions or modified adaptation algorithms from those discussed above may be used. For example, in a system that includes target adaptation in normal operation, the regularized MMSE cost function and regularized LMS algorithm may both include terms for t 228 and b 230.

Many other variations would be apparent to one of ordinary skill in the art in view of this disclosure. For example, another use of regularization may be to implement a soft saturation. For example, in some implementations of minimum BER (MBER) adaptation, a hard saturation constraint may be used to restrain the MBER parameters from moving too far from the least squares (LS) parameters. Such wandering may cause fixed point saturation and degrade performance. Hard saturation may prevent the adaptation from moving the coefficient beyond a certain point. For example, if a coefficient is to be saturated to a value of +7, the system may prevent the adaptation of the coefficient from moving above +7 (e.g. using an if-then statement in firmware or similar circuit logic). In some examples of the subject matter disclosed herein, introducing regularization may add an additional term to the MBER cost function to penalize movement from the LS values. This outperforms hard saturation as regularization as disclosed herein may allow the coefficients to move when changes in the coefficients produce a reduction in the cost function while providing a similar restraint to wandering as that provided by hard saturation.

Figure 3:
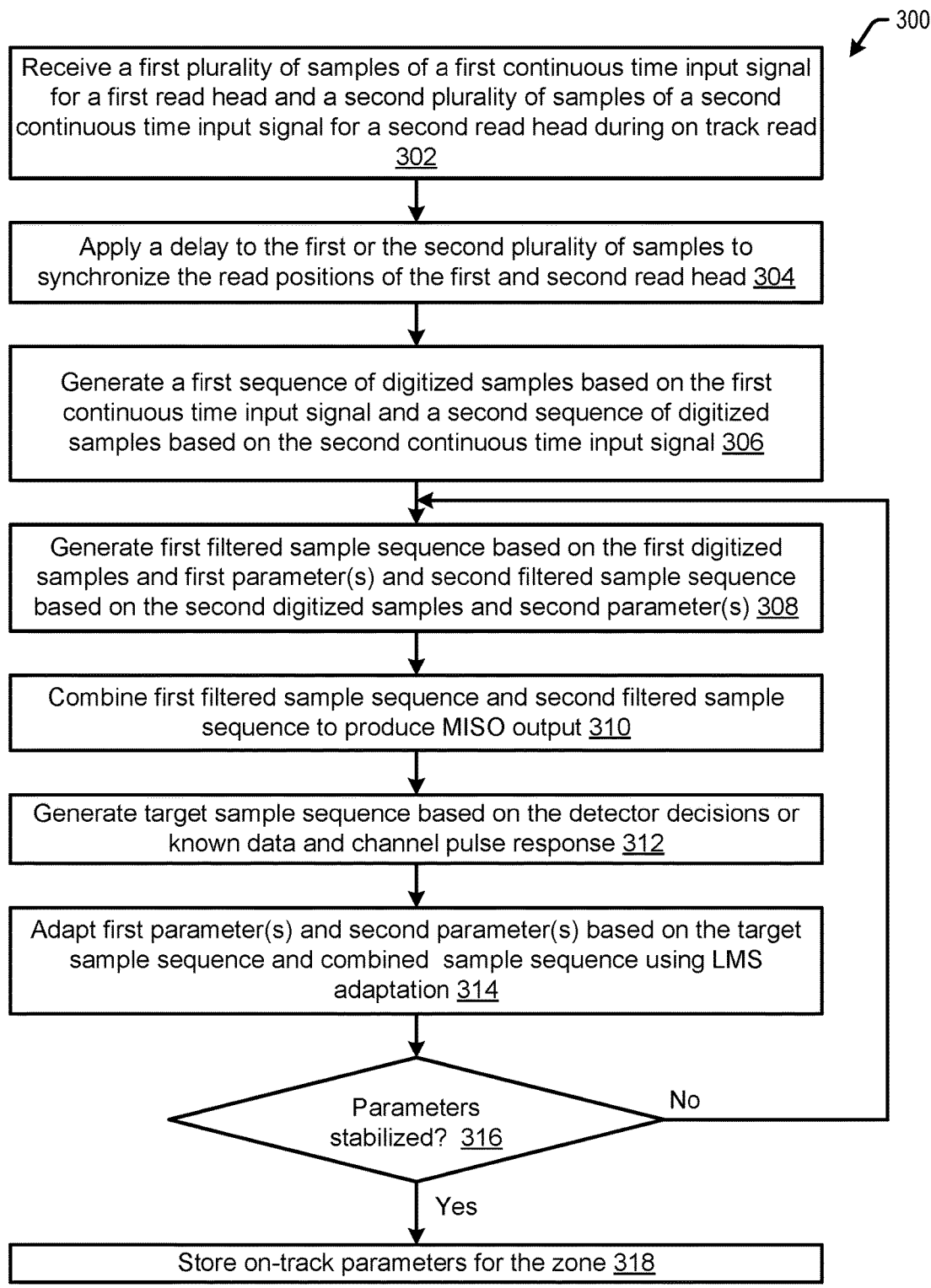
FIG. 3 is a flowchart of a method of regularized parameter adaptation, in accordance with certain embodiments of the present disclosure.

Referring to FIG. 3, a flowchart of a method of regularized parameter adaptation is shown and is generally designated 300. More particularly, flowchart 300 may be manufacturing or training operations to generate the regularization data 120 as detailed above with respect to FIGS. 1 and 2 (e.g. for a current zone).

The system may receive a first plurality of samples of a first continuous time input signal for a first read head and a second plurality of samples of a second continuous time input signal for a second read head during an on track read at 302. The system may then apply a delay to the first or the second plurality of samples to synchronize the read positions of the first and second read head at 304. At 306, the system may generate a first sequence of digitized samples based on the first continuous time input signal and a second sequence of digitized samples based on the second continuous time input signal.

Next, the system may generate a first filtered sample sequence based on the first digitized samples and one or more first parameter(s) and a second filtered sample sequence based on the second digitized samples and one or more second parameter(s) at 308. At 310, the system may combine the first filtered sample sequence and the second filtered sample sequence to produce a MISO output which may be an equalized sample sequence. At 312, the system may generate a target sample sequence based on detector decisions or known data and a channel pulse response.

Then, at 314, the system may adapt the first parameter(s) and the second parameter(s) based on an error between the target sample sequence and the equalized sample sequence using, for example, LMS adaptation. While LMS adaptation is used as an example adaptation algorithm, other adaptation algorithms may be used in the adaptation of the first and second parameters.

The system may then determine if the first parameter(s) and the second parameter(s) have stabilized at 316. If the parameters have stabilized, at 318, the system may store the first parameter(s) and the second parameter(s) for the current zone (e.g. as regularization data 120). If the parameters have not stabilized, the system may return to 308 for additional adaptation operations. Though not shown, in some embodiments, additional operations, such as one or more of operations 302-306 may also be repeated when the parameters have not stabilized or the stability determination may be performed for new samples until the parameters have stabilized in general for data samples of the zone.

Figure 4:
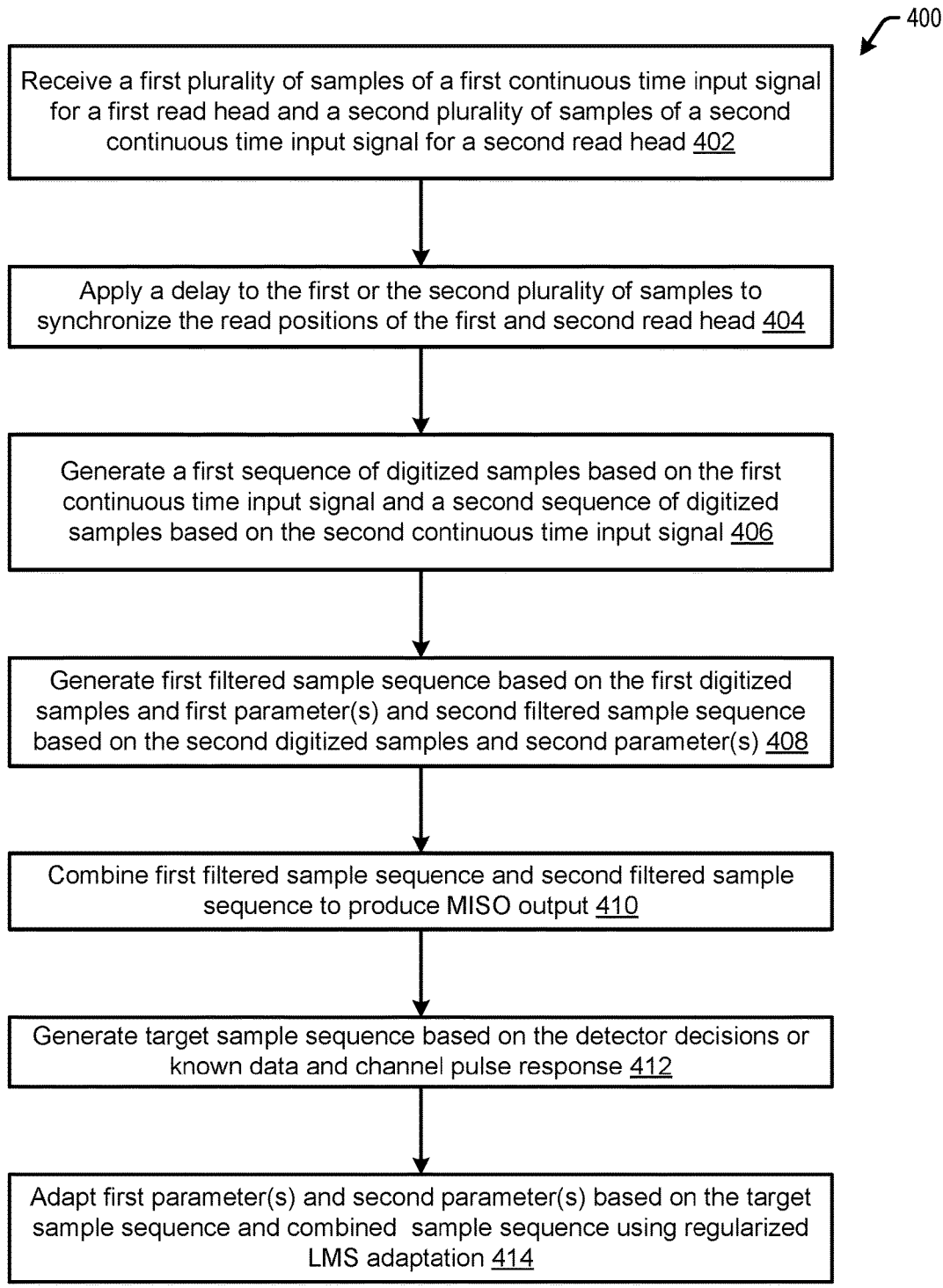
FIG. 4 is a flowchart of a method of regularized parameter adaptation, in accordance with certain embodiments of the present disclosure.

Referring to FIG. 4, a flowchart of a method of regularized parameter adaptation is shown and is generally designated 400. More particularly, flowchart 400 may be the sampling, equalization and regularized parameter adaptation operations performed during a read or receive operation and may be performed as detailed above with respect to FIGS. 1 and 2.

In operation, at 402, the system may receive a first plurality of samples of a first continuous time input signal for a first read head and a second plurality of samples of a second continuous time input signal for a second read head, for example, for a current data sector. At 404, the system may apply a delay to the first or the second plurality of samples to synchronize the read positions of the first and second read head. Next, the system may generate a first sequence of digitized samples based on the first continuous time input signal and a second sequence of digitized samples based on the second continuous time input signal at 406.

At 408, the system may generate a first filtered sample sequence based on the first digitized samples and first parameters and a second filtered sample sequence based on the second digitized samples and second parameters. As discussed above, the parameters may be weights, coefficients or etc. for use as tap values of the plurality of FIR filters of a MISO equalizer. The parameters may be adapted by and supplied to the MISO equalizer from an adaptation component. Next, at 410, the system may combine the first filtered sample sequence and the second filtered sample sequence to produce a MISO output, which may be an equalized sample sequence.

At 412, the system may generate a target sample sequence based on detector decisions or known data and a channel pulse response. Finally, at 414, the system may adapt the first parameter(s) and the second parameter(s) based on the target sample sequence and the combined equalized sample sequence (e.g. based on a difference there between) using regularized LMS adaptation.

All steps listed for the methods 300 and 400 may be applied to systems that have adaptive parameters. As mentioned above, other adaptation algorithms could be substituted for MMSE and these processes may be utilized for parameters of other circuits such as decoders, equalizers, ADCs and so on. In addition, in view of this disclosure, one of ordinary skill in the art would understand that the number of read heads or input signals may be greater than two (e.g. a plurality). Many other variations would be apparent in view of this disclosure. Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

Figure 5:
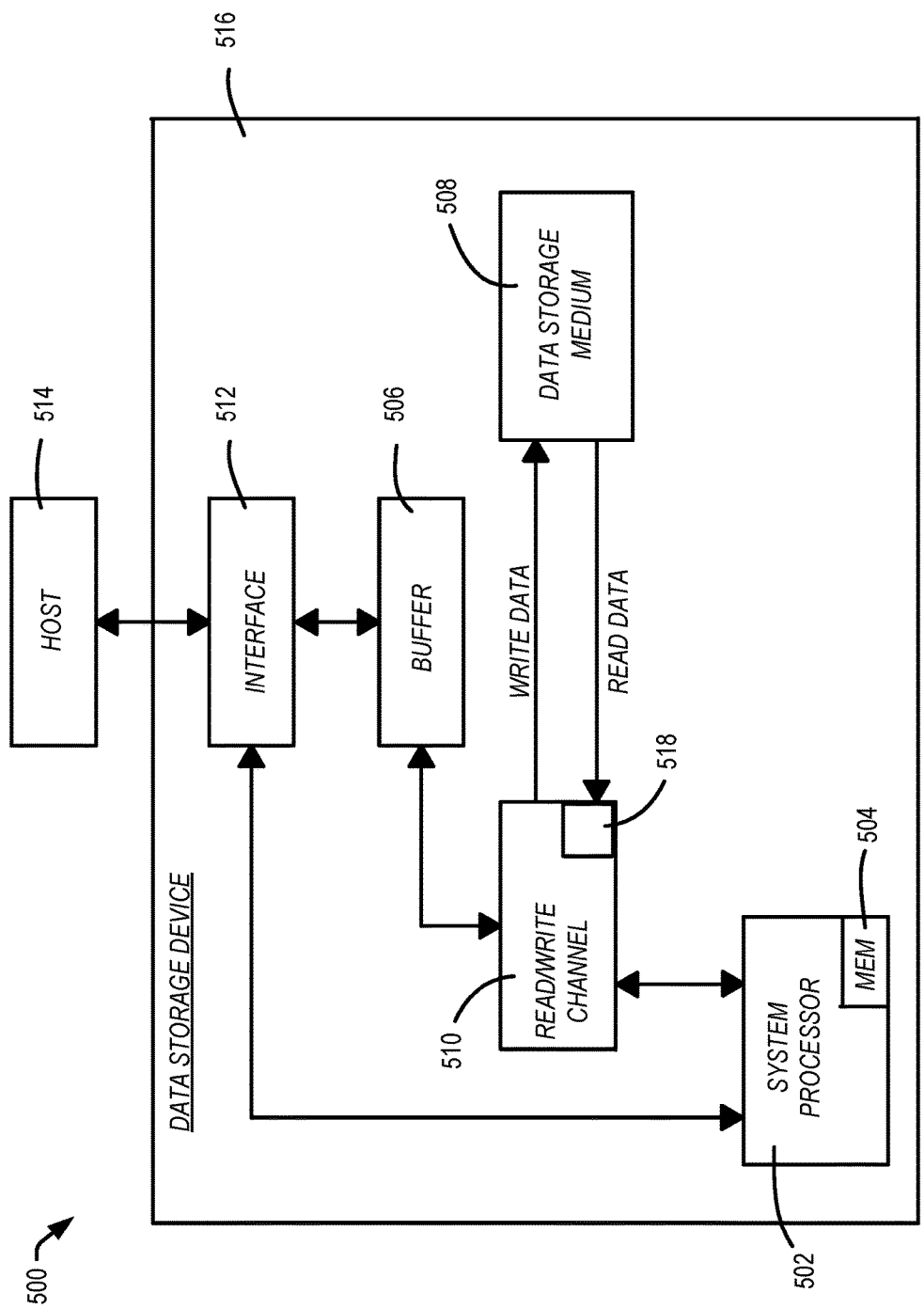
FIG. 5 is a block diagram of a system including regularized parameter adaptation, in accordance with certain embodiments of the present disclosure.

Referring to FIG. 5, a block diagram of a system including regularized parameter adaptation is shown and generally designated 500. The system 500 can be an example of a data storage device (DSD), and may be an example implementation of systems 100 and 200. The DSD 516 can optionally connect to and be removable from a host device 514, which can be a device or system having stored data, such as a desktop computer, a laptop computer, a server, a digital video recorder, a photocopier, a telephone, a music player, other electronic devices or systems not listed, or any combination thereof. The data storage device 516 can communicate with the host device 514 via the hardware/firmware based host interface circuit 512 that may include a connector (not shown) that allows the DSD 516 to be physically connected and disconnected from the host 514.

The DSD 516 can include a system processor 502, which may be a programmable controller, and associated memory 504. The system processor 502 may be part of a system on chip (SOC). A buffer 506 may temporarily store data during read and write operations and can include a command queue. The read/write (R/W) channel 510 can encode data during write operations to, and reconstruct data during read operations from, the data storage medium 508. The data storage medium 508 is shown and described as a hard disc drive, but may be other types of magnetic medium, such as a flash medium, optical medium, or other medium, or any combination thereof.

The R/W channel 510 may receive data from more than one data storage medium at a time, and in some embodiments can also receive multiple data signals concurrently, such as from more than one output of a read head. For example, storage systems having two-dimensional magnetic recording (TDMR) systems can have multiple reading or recording elements, and can read from two tracks simultaneously or nearly simultaneously. Multi-dimensional recording (MDR) systems can receive two or more inputs from multiple sources (e.g. recording heads, flash memory, optical memory, and so forth). The R/W channel 510 can combine multiple inputs and provide a single output, as described in examples herein.

The block 518 can implement all of or part of the systems and functionality of systems and methods 100, 200, 300 and 400. In some embodiments, the block 518 may be a separate circuit, integrated into the R/W channel 510, included in a system on chip, firmware, software, or any combination thereof.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture and voltages that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a circuit configured to process at least one input signal using a set of channel parameters, the circuit further configured to:
   adapt, using a regularized adaptation algorithm, a first set of channel parameters for use by the circuit as the set of channel parameters in processing the at least one input signal, the regularized adaptation algorithm penalizing deviations by the first set of channel parameters from a corresponding predetermined second set of channel parameters, the regularized adaptation algorithm further including an adjustable parameter that scales the penalty for deviation by the first set of channel parameters from the second set of channel parameters; and
   perform the processing of the at least one input signal using the first set of channel parameters as the set of channel parameters.

2. The apparatus of claim 1, further comprising the circuit further including a Multiple-Input Single Output (MISO) equalizer that performs the processing of the at least one input signal using the set of channel parameters as filter taps.

3. The apparatus of claim 2, further comprising the at least one input signal being a plurality of digital signals that correspond to a plurality of read heads.

4. The apparatus of claim 3, further comprising the second set of channel parameters being generated using an unregularized version of the regularized adaptation algorithm during a prior on-track read.

5. The apparatus of claim 3, further comprising:
   a memory storing the second set of channel parameters;
   the at least one input signal based on readback signals read by the plurality of read heads from a sector of a magnetic storage medium; and
   the second set of channel parameters corresponding to an area of the magnetic storage medium including the sector.

6. The apparatus of claim 3, the circuit further comprising a plurality of analog to digital converters (ADCs), each of the plurality of digital signals being generated by a corresponding ADC of the plurality of ADCs;
   the MISO equalizer comprising:
   a plurality of finite impulse response (FIR) filters, the set of channel parameters including filter taps of the plurality of finite impulse response filters, each of the plurality of digital signals being processed by a corresponding FIR filter of the plurality of finite impulse response filters; and
   a combiner circuit that combines the outputs of the plurality of FIR filters.

7. The apparatus of claim 6, further comprising the circuit further including a detector that performs bit detection operations on the output of the MISO equalizer, the circuit further configured to:
   determine a target based on detector decisions of the detector and a channel impulse response;
   determine an error based on a difference of the MISO equalizer output and the target; and
   perform the adaptation based on the error.

8. The apparatus of claim 1 further comprising the regularized adaptation algorithm being a regularized least mean squares (LMS) adaptation algorithm or a regularized minimum mean squared error (MMSE) adaptation algorithm.

9. A system comprising:
   a channel circuit including a Multiple-Input Single Output (MISO) equalizer and configured to process at least one input signal using a set of channel parameters being filter taps of the MISO equalizer;
   an adaptation circuit configured to:
   adapt, using a regularized adaptation algorithm, a first set of channel parameters for use by the channel circuit as the set of channel parameters in processing the at least one input signal, the regularized adaptation algorithm penalizing deviations by the first set of channel parameters from a predetermined corresponding second set of channel parameters, the regularized adaptation algorithm being a regularized least mean squares (LMS) adaptation algorithm or a regularized minimum mean squared error (MMSE) adaptation algorithm, and the regularized adaptation algorithm including an adjustable parameter that scales the penalty for deviation by the first set of channel parameters from the second set of channel parameters.

10. The system of claim 9 further comprising the at least one input signal being a plurality of digital signals that correspond to a plurality of read heads.

11. The system of claim 10 further comprising:
a memory storing the second set of channel parameters, the second set of channel parameters being generated using an unregularized version of the regularized adaptation algorithm during a prior on-track read;
the at least one input signal based on readback signals read by the plurality of read heads from a sector of a magnetic storage medium; and
the second set of channel parameters corresponding to an area of the magnetic storage medium including the sector.

12. The system of claim 9 further comprising:
a plurality of analog to digital converters (ADCs), each of the plurality of digital signals being generated by a corresponding ADC of the plurality of ADCs;
the MISO equalizer comprising:
a plurality of finite impulse response (FIR) filters, the set of channel parameters including filter taps of the plurality of finite impulse response filters, each of the plurality of digital signals being processed by a corresponding FIR filter of the plurality of FIR filters; and
a combiner circuit that combines the outputs of the plurality of FIR filters;
a detector that performs bit detection operations on the output of the MISO equalizer;
a target circuit configured to:
determine a target based on detector decisions of the detector and a channel impulse response;
determine an error based on a difference of the MISO equalizer output and the target; and
the adaptation circuit further configured to perform the adaptation based on the error.

13. A method comprising:
adapting, by a circuit configured to process at least one input signal using a set of channel parameters and using a regularized adaptation algorithm, a first set of channel parameters for use by the circuit as the set of channel parameters in processing the at least one input signal, the regularized adaptation algorithm penalizing deviations by the first set of channel parameters from a corresponding predetermined second set of channel parameters, the regularized adaptation algorithm further including an adjustable parameter that scales a penalty for deviation by the first set of channel parameters from the second set of channel parameters; and
performing the processing of the at least one input signal using the first set of channel parameters as the set of channel parameters.

14. The method of claim 13 further comprising the circuit including a Multiple-Input Single Output (MISO) equalizer that uses the set of channel parameters as filter taps to perform the processing of the at least one input signal.

15. The method of claim 14 further comprising the regularized adaptation algorithm being a regularized least mean squares (LMS) adaptation algorithm or a regularized minimum mean squared error (MMSE) adaptation algorithm.

16. The method of claim 13 further comprising:
the at least one input signal being one or more digitized sample sequences corresponding to a sector of a magnetic storage medium;
the second set of channel parameters corresponding to an area of the magnetic storage medium including the sector and being generated using an unregularized version of the regularized adaptation algorithm during a prior on-track read of data written to the area of the magnetic storage medium including the sector.

* * * * *